US009936298B2

(12) United States Patent
Buck et al.

(10) Patent No.: US 9,936,298 B2
(45) Date of Patent: Apr. 3, 2018

(54) MEMS COMPONENT INCLUDING A SOUND-PRESSURE-SENSITIVE DIAPHRAGM ELEMENT AND PIEZOSENSITIVE SIGNAL DETECTION

(71) Applicant: Robert Bosch GmbH, Stuttgart (DE)

(72) Inventors: Thomas Buck, Gerlingen-Schillerhoehe (DE); Fabian Purkl, Gerlingen (DE); Michael Stumber, Korntal-Muenchingen (DE); Ricardo Ehrenpfordt, Korntal-Muenchingen (DE); Rolf Scheben, Reutlingen (DE); Benedikt Stein, Stuttgart (DE); Christoph Schelling, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/211,137

(22) Filed: Jul. 15, 2016

(65) Prior Publication Data
US 2017/0026754 A1   Jan. 26, 2017

(30) Foreign Application Priority Data

Jul. 22, 2015   (DE) .......................... 10 2015 213 774

(51) Int. Cl.
*H04R 19/04* (2006.01)
*H04R 7/14* (2006.01)
(Continued)

(52) U.S. Cl.
CPC ............ *H04R 7/14* (2013.01); *B81B 3/0072* (2013.01); *H04R 7/18* (2013.01); *H04R 19/005* (2013.01);
(Continued)

(58) Field of Classification Search
CPC ... H04R 7/14; H04R 7/18; H04R 7/20; H04R 17/02; H04R 19/005; H04R 19/013;
(Continued)

(56) References Cited

U.S. PATENT DOCUMENTS

5,870,482 A * 2/1999 Loeppert ............... B81B 3/0072
                                                 381/174
6,535,460 B2 * 3/2003 Loeppert ............... B81B 3/0072
                                                 367/181
(Continued)

*Primary Examiner* — Huyen D Le
(74) *Attorney, Agent, or Firm* — Norton Rose Fulbright US LLP; Gerard Messina (57) ABSTRACT

For a MEMS component, in the layer structure of which at least one sound-pressure-sensitive diaphragm element is formed, which spans an opening or cavity in the layer structure and the deflections of which are detected with the aid of at least one piezosensitive circuit element in the attachment area of the diaphragm element, design measures are provided, by which the stress distribution over the diaphragm surface may be influenced intentionally in the event of deflection of the diaphragm element. In particular, measures are provided, by which the mechanical stresses are intentionally introduced into predefined areas of the diaphragm element, to thus amplify the measuring signal. For this purpose, the diaphragm element includes at least one designated bending area, which is defined by the structuring of the diaphragm element and is more strongly deformed in the event of sound action than the adjoining diaphragm sections.

14 Claims, 7 Drawing Sheets

(51) Int. Cl.
  *H04R 7/18* (2006.01)
  *H04R 19/00* (2006.01)
  *H04R 31/00* (2006.01)
  *B81B 3/00* (2006.01)
  *H04R 23/00* (2006.01)
  *H04R 17/02* (2006.01)

(52) U.S. Cl.
  CPC ........... *H04R 19/04* (2013.01); *H04R 23/006* (2013.01); *H04R 31/006* (2013.01); *H04R 17/02* (2013.01); *H04R 2201/003* (2013.01)

(58) Field of Classification Search
  CPC .... H04R 19/016; H04R 19/04; H04R 23/006; H04R 2201/003; H04R 31/003; H04R 31/006; B81B 3/0018; B81B 3/0072
  USPC ........ 381/113, 114, 116, 369, 173, 174, 175, 381/190, 191; 29/25.41, 25.42; 367/157, 367/170, 181; 438/53; 310/324
  See application file for complete search history.

(56) References Cited

U.S. PATENT DOCUMENTS

| | | | |
|---|---|---|---|
| 7,362,873 B2 * | 4/2008 | Pedersen | B81B 3/0072 381/113 |
| 2014/0084395 A1 * | 3/2014 | Sparks | G01L 9/008 257/416 |

* cited by examiner

MEMS COMPONENT INCLUDING A SOUND-PRESSURE-SENSITIVE DIAPHRAGM ELEMENT AND PIEZOSENSITIVE SIGNAL DETECTION

CROSS REFERENCE

The present application claims the benefit under 35 U.S.C. § 119 of German Patent Application No. DE 102015213774.0 filed on Jul. 22, 2015, which is expressly incorporated herein by reference in its entirety.

BACKGROUND INFORMATION

The present invention relates to a MEMS component, in the layer structure of which at least one sound-pressure-sensitive diaphragm element is formed, which spans an opening or cavity in the layer structure. The diaphragm element is structured and the deflections of the diaphragm element are detected with the aid of at least one piezosensitive circuit element, which is situated in the area of the attachment of the diaphragm element to the layer structure.

A particular advantage of piezosensitive MEMS microphone components is that—in contrast to capacitive MEMS microphone components—they may be equipped very easily with a "wake-up" functionality. They may thus be provided very easily so that they only consume power if needed, i.e., for example, only if a specific sound level is exceeded. The power consumption of piezosensitive MEMS microphone components in the "always-on" operating mode is thus significantly less than that of capacitive MEMS microphone components.

Piezosensitive MEMS microphone components are described in U.S. Patent Application Pub. No. 2014/0084395 A1. These MEMS microphone components each include a structured sound-pressure-sensitive diaphragm element having a piezoelectric layer structure for signal detection. The structuring of the diaphragm element is used here for pressure equalization between the two sides of the diaphragm element and is to promote the sound-pressure-related diaphragm movement. For this purpose, a uniform grid arrangement of passage openings in the entire diaphragm area is proposed, or also trench slits, by which the diaphragm element is divided into paddle-like segments. The piezoelectric layer structure is situated in each case in the edge area of the diaphragm element, where the greatest elongation or the greatest mechanical stresses occur when the diaphragm element is deflected.

SUMMARY

The present invention provides design measures, by which the stress distribution over the diaphragm surface may be intentionally influenced in the event of deflection of the diaphragm element. In particular, measures are provided by which the mechanical stresses are intentionally introduced into predefined areas of the diaphragm element, to thus amplify the measuring signal.

This is achieved according to the present invention in that the diaphragm element includes at least one designated bending area, which is defined by the structuring of the diaphragm element and is more strongly deformed in the event of sound action than the adjoining diaphragm sections.

Fundamentally, there are various possibilities for the implementation of a MEMS component according to the present invention, in particular with regard to the shape and suspension of the diaphragm element, but also with regard to the layout and the type of the structuring of the diaphragm element.

The structuring of the diaphragm element according to the present invention may thus alternately include an enlargement or reduction of the diaphragm thickness and/or the formation of passage openings in defined areas, to thus provide stiffened diaphragm sections and designated bending areas. The diaphragm thickness may be intentionally increased, for example, by locally delimited material deposition in specific areas. Alternatively thereto, a sectional stiffening of the diaphragm element may also be advantageously achieved by forming corrugations similar to a corrugated plate or bulge. Designated bending areas may be implemented in the form of particularly thin-walled diaphragm sections, but also by producing passage openings in the diaphragm element if structures similar to spring elements are at least partially detached from the diaphragm composite in this case.

The structuring of the diaphragm element of a MEMS component according to the present invention is preferably designed in such a way that the mechanical stress in the area of the attachment of the diaphragm element to the layer structure, namely where the piezosensitive circuit elements for signal detection are situated, is as large as possible, so that the measuring signal is also as large as possible. In one advantageous refinement of the present invention, the attachment of the diaphragm element to the layer structure, i.e., the diaphragm edge, is concave in at least this area. The elongation of the attachment area is thereby increased in the event of deflection of the diaphragm element.

In another advantageous specific embodiment of the present invention, the diaphragm element is attached to the layer structure via at least one spring element. In this case, the mechanical stress occurring in the event of deflection of the diaphragm element concentrates in the spring elements, where the piezosensitive circuit elements are also situated.

As already mentioned, the diaphragm element of the MEMS component according to the present invention may have any arbitrary shape and size and may also be attached in different ways to the layer structure of the component. The diaphragm element may thus also be formed like a paddle, in that it is only attached to the layer structure on one side and extends with its free end over the opening or cavity in the layer structure. The deflection of such diaphragm elements is relatively large at a given sound level. However, with this diaphragm layout, the flow path between the two sides of the diaphragm element also has a relatively large area, which has a disadvantageous effect on the microphone sensitivity. In one advantageous specific embodiment of the present invention, the diaphragm element is therefore attached on all sides to the layer structure, but due to its structuring it includes multiple diaphragm sections of high stiffness, which extend from the diaphragm edge up into the middle area of the diaphragm element and are connected to one another by designated bending areas. These designated bending areas also extend from the diaphragm edge up into the middle area of the diaphragm element. In this way, a leakage air flow between the two sides of the diaphragm element is suppressed or at least largely limited, while the diaphragm sections of high stiffness behave at least to some extent like individual paddle elements in the event of sound action.

BRIEF DESCRIPTION OF THE DRAWINGS

As described above, there are various options for developing and refining the teaching of the present invention advantageously. For this purpose, reference is made to the description below of several exemplary embodiments of the present invention.

DETAILED DESCRIPTION OF EXAMPLE EMBODIMENTS

Figure 1A:
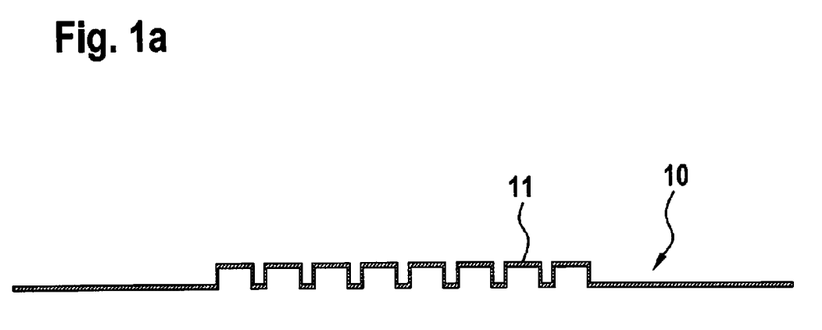
FIGS. 1a, 1b show a sectional view and a perspective partial view of a circular diaphragm element.
Figure 1B:
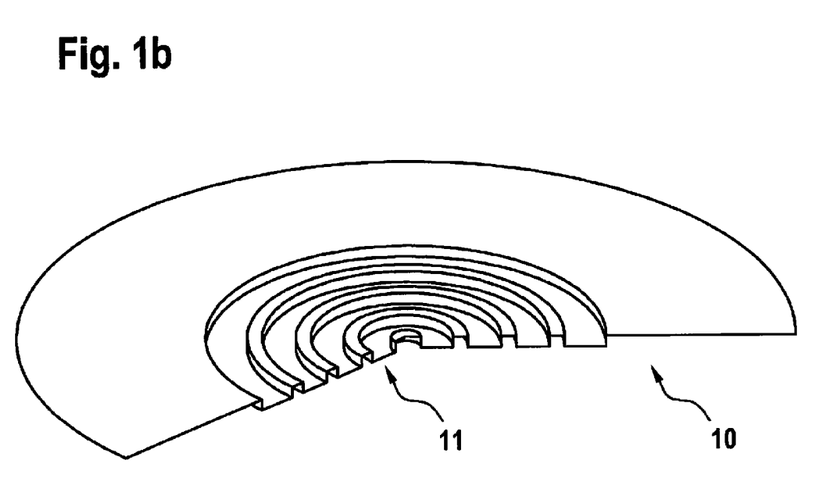
Figure 2A:
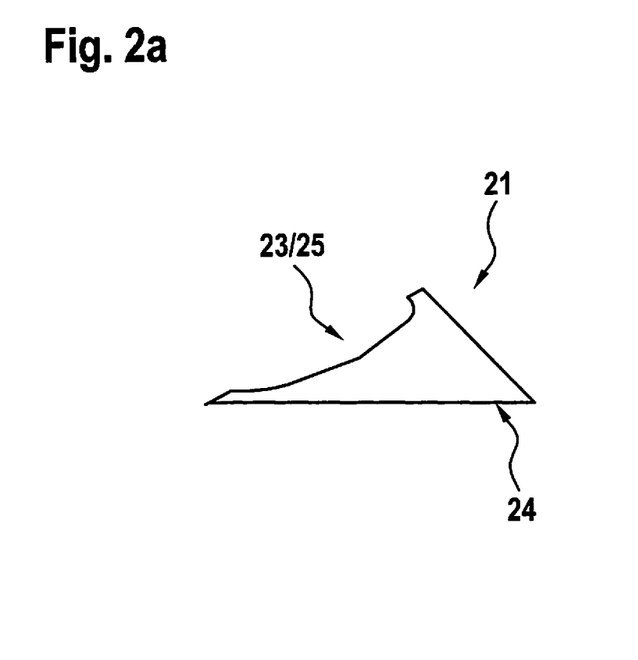
FIGS. 2a, 2b show perspective views of two paddle-like diaphragm elements including an attachment that is at least concave in section.
Figure 2B:
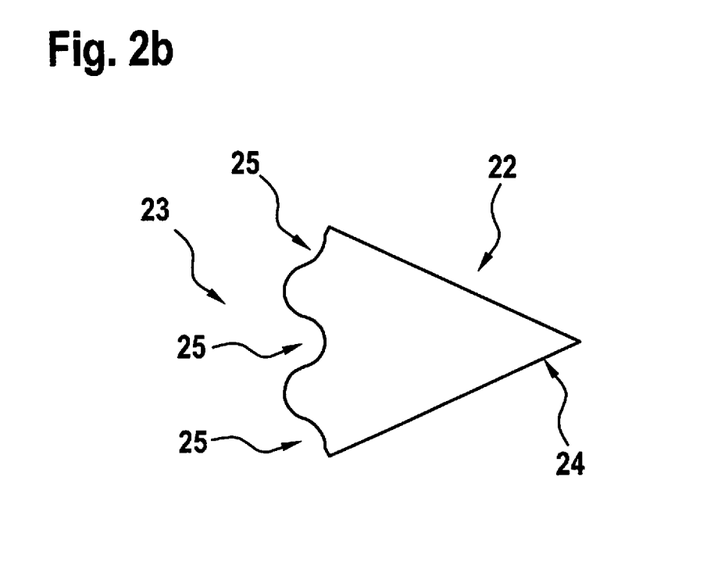

Circular diaphragm element 10 shown in FIGS. 1a and 1b is a micromechanical structure element, which is implemented in the layer structure of a MEMS component and spans an opening or cavity in the layer structure. Accordingly, diaphragm element 10 is attached via its outer edge area to the layer structure of the MEMS component. The illustration of the component structure is omitted here.

Shape, size, and thickness and also the material of diaphragm element 10 are selected in such a way that diaphragm element 10 is sound-pressure-sensitive, i.e., it may be used as a microphone diaphragm. The deflections of diaphragm element 10 are detected with the aid of piezosensitive circuit elements, the illustration of which was also omitted here. These piezosensitive circuit elements are typically situated in the area of the attachment of diaphragm element 10 to the layer structure, where the greatest material stretching is to be expected.

To increase the deformation in the attachment area, the middle area of circular diaphragm element 10 was stiffened. For this purpose, the middle area of diaphragm element 10 was provided with a structuring in the form of circular concentrically situated corrugations 11. FIG. 1a illustrates the concentric arrangement of the circular groove structure and FIG. 1b illustrates the formation like a corrugated plate of diaphragm element 10 in the middle area.

In contrast to diaphragm element 10 shown in FIGS. 1a and 1b, FIGS. 2a and 2b show diaphragm elements 21 and 22, which are only attached on one side to the layer structure of a MEMS component. Both diaphragm elements 21 and 22 have a generally triangular basic shape and are connected with one triangle side 23 to the edge area of an opening or cavity in the layer structure, while pointed end 24 protrudes freely over this opening or cavity. As in the case of diaphragm element 10, the piezosensitive circuit elements for detecting sound-pressure-related deflections are also situated in attachment area 23 of diaphragm element 21 and 22 here. To increase the mechanical stresses occurring at the location of the piezosensitive circuit element, free end 24 of diaphragm element 21 and 22 may be thicker than attachment area 23. In the two exemplary embodiments shown here, the elongation of attachment area 23 is additionally also increased by the at least sectionally concave design of the diaphragm edge. These concave sections are identified with reference numeral 25 in FIGS. 2a and 2b.

Figure 3A:
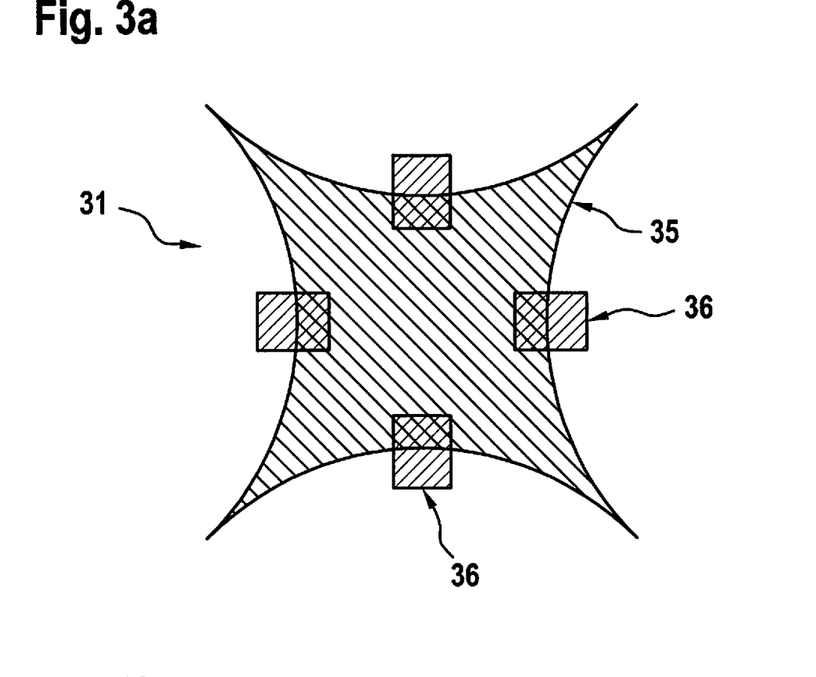
FIGS. 3a, 3b show schematic top views of a closed diaphragm element including concave edges (FIG. 3a) and of four paddle-like diaphragm elements which protrude over an opening in the layer structure (FIG. 3b).

The exemplary embodiment shown in FIG. 3a illustrates that the sectionally concave design of the attachment area or the edge of the diaphragm element is in no way restricted to paddle-like diaphragm elements. Thus, diaphragm element 31 shown in FIG. 3a is a quadrangular closed diaphragm including concavely formed diaphragm edges 35. This diaphragm 31 is attached on all sides to the layer structure of a MEMS component and spans an opening or cavity in the layer structure. The diaphragm deflections are detected here with the aid of four piezosensitive circuit elements 36, which are each centrally situated on concavely formed diaphragm edges 35. The structuring according to the present invention of diaphragm 31 is not shown here, which is designed in such a way that the edge area forms a designated bending area, i.e., an area which deforms earlier and more strongly in the event of sound action than the middle area of diaphragm 31.

Figure 3B:
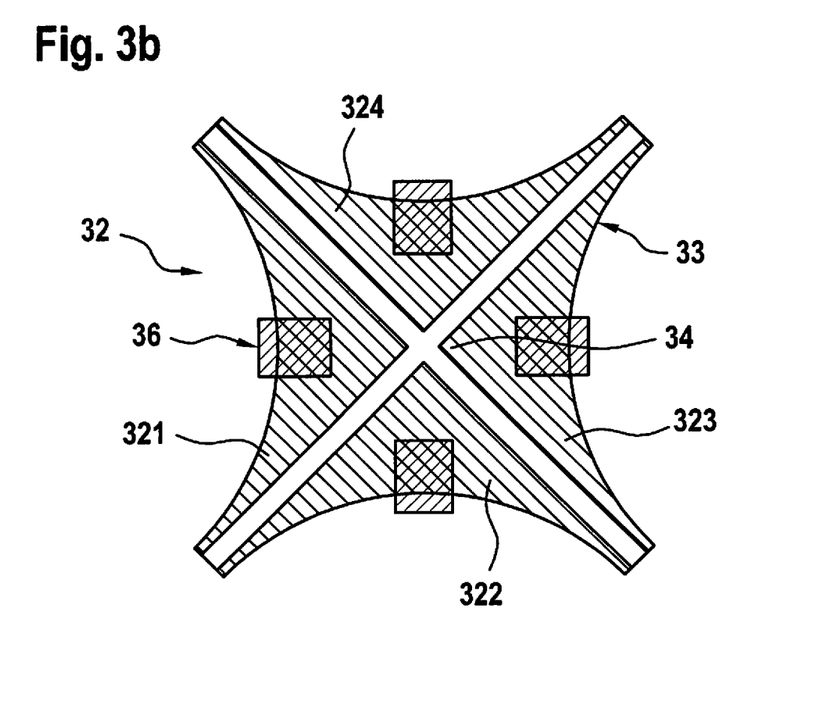

This also applies to specific embodiment 32 shown in FIG. 3b, having four diaphragm elements 321 through 324, which have been created by cutting through a diaphragm, as shown in FIG. 3a.

Accordingly, each of diaphragm elements 321 through 324 is connected with one concavely formed triangle side 33 to the edge area of an opening or cavity in the layer structure, while pointed end 34 protrudes freely over this opening or cavity. Piezosensitive circuit elements 36 are each centrally situated on concavely formed attachment area 33.

Figure 4A:
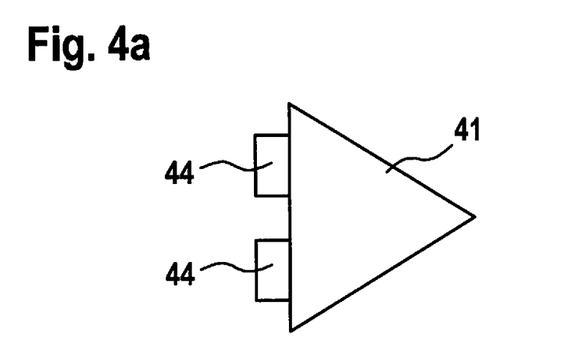
FIGS. 4a through 4c show three different spring suspensions for paddle-like diaphragm elements.
Figure 4B:
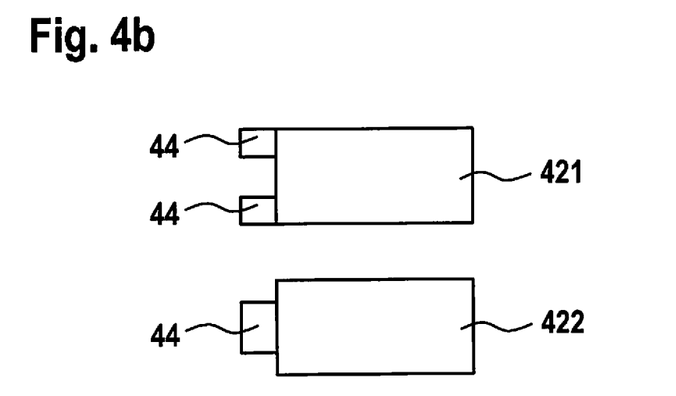
Figure 4C:
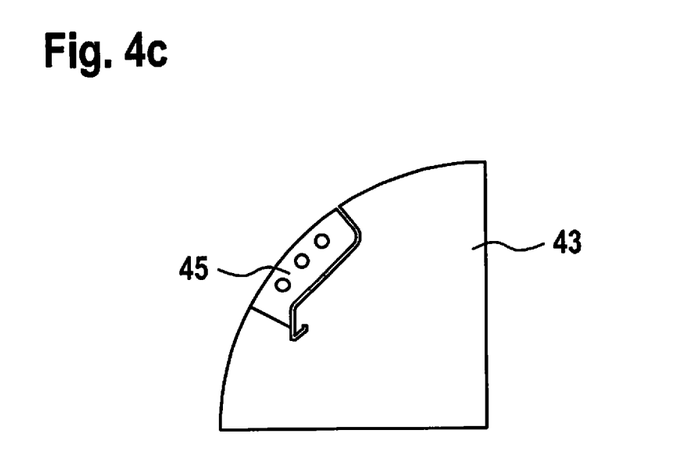

In each of FIGS. 4a through 4c, paddle-like diaphragm elements 41, 421 and 422, and 43 of different shapes are shown, which are attached via spring elements 44 and 45 to the layer structure of a MEMS component and protrude over an opening or cavity in the layer structure. The piezosensitive circuit elements for detecting the paddle deflections are each situated here in the area of spring elements 44 and 45. Spring elements 44 and 45 were structured out of the edge area of particular diaphragm element 41, 421, 422, and 43, respectively.

FIG. 4a shows a triangular diaphragm element 41 which is attached via two web-like spring elements 44 on one triangle side to the layer structure of the MEMS component.

FIG. 4b shows two rectangular diaphragm elements 421 and 422, which are also attached via one or two web-like spring elements 44 on one rectangle side to the layer structure of the MEMS component.

FIG. 4c shows a diaphragm element 43, which has the shape of a quarter-circle segment and is attached via a spring structure 45 to the layer structure of the MEMS component, which is structured out of the edge area, which is in the form of a circular arc, of diaphragm element 43.

Figure 5A:
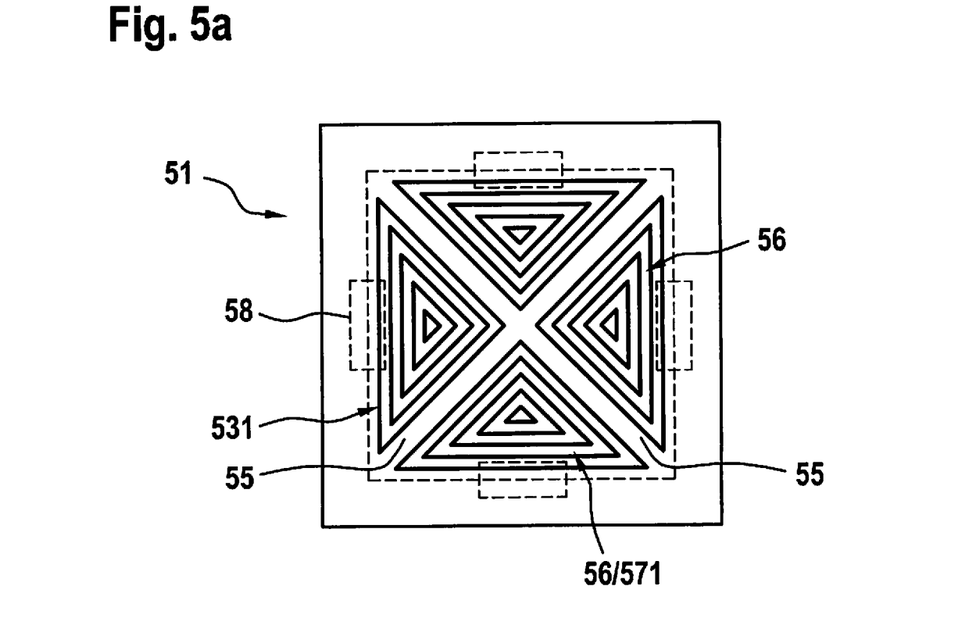
FIGS. 5a through 5c show schematic top views (FIGS. 5a, 5b) and a sectional view (FIG. 5c) of two MEMS components 51 and 52 including structured diaphragm elements according to the present invention.
Figure 5B:
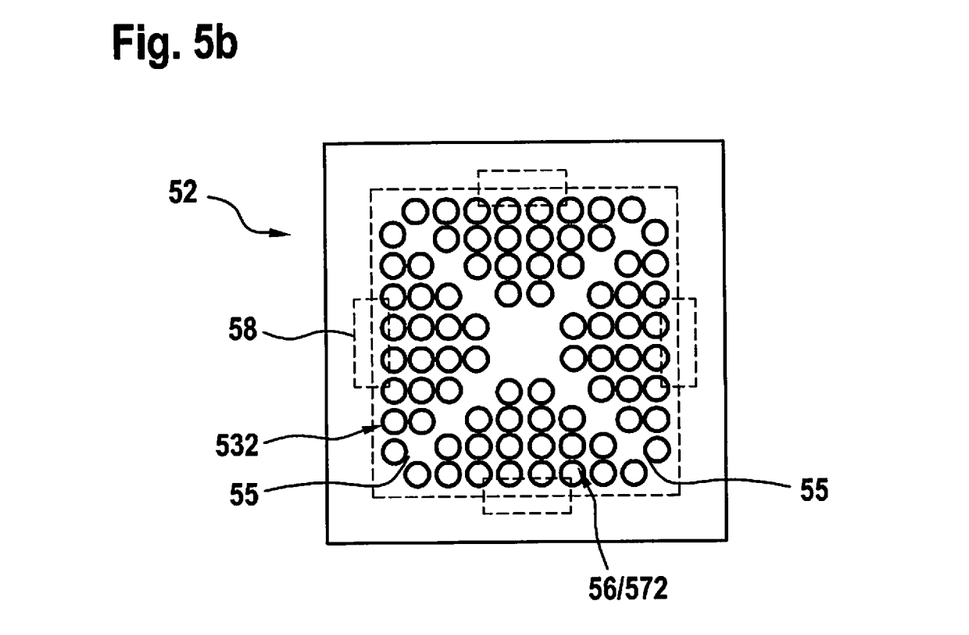
Figure 5C:
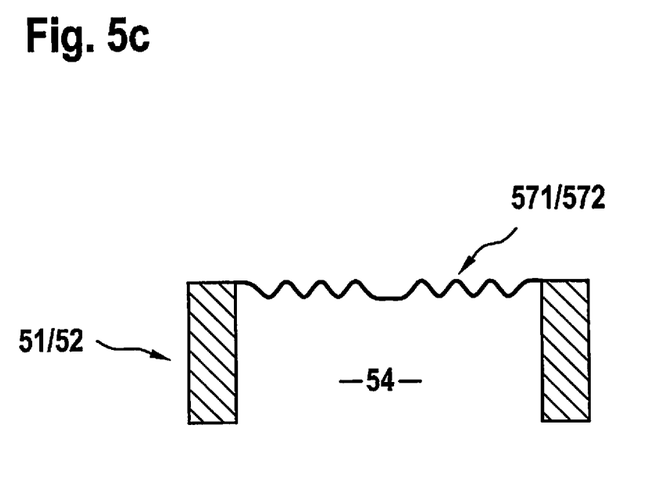

The two MEMS components 51 and 52 shown in FIGS. 5a and 5b are conceived as microphone components, but may also be used as pressure sensor elements, since they each include closed diaphragm elements 531 and 532, respectively. Diaphragm elements 531 and 532 are formed in the layer structure of respective components 51 and 52 and span an opening 54 in the component rear side, which is illustrated by FIG. 5c. Both diaphragm elements 531 and 532 are generally rectangular or quadrangular and are attached to the layer structure in a circumferentially closed way. The diaphragm deflections are detected with the aid of piezosensitive, i.e., piezoelectric or piezoresistive circuit elements 58, which are situated in the attachment area of diaphragm elements 531 and 532, and in each case centrally on each side of the square diaphragm surface.

In the exemplary embodiment of the present invention described here, diaphragm elements 531 and 532 are structured in such a way that, in addition to the attachment area, they also have designated bending areas 55, which extend, proceeding from the diaphragm corners, diagonally over diaphragm elements 531 and 532. Triangular diaphragm segments 56, which are separated by designated bending areas 55, are stiffened in relation to these designated bending areas 55. For this purpose, diaphragm elements 531 and 532 were provided in these diaphragm segments 56 with corrugations 571 and 572, respectively. In the case of component 51, corrugations 571 are implemented in the form of concentrically situated triangular circumferential grooves. In the case of component 52, corrugations 572 are a grid of bulge-like protrusions. The sectional view of FIG. 5c illustrates the type of the structuring of diaphragm elements 531 and 532.

Designated bending areas 55 promote a paddle-like deflection of individual diaphragm segments 56 of diaphragm elements 531 and 532. Relatively large mechanical stresses occur in the attachment area of individual diaphragm segments 56 and also at the location of piezosensitive circuit elements 58, which contributes to an amplification of the measuring signal and is thus advantageous for the signal detection.

Figure 6A:
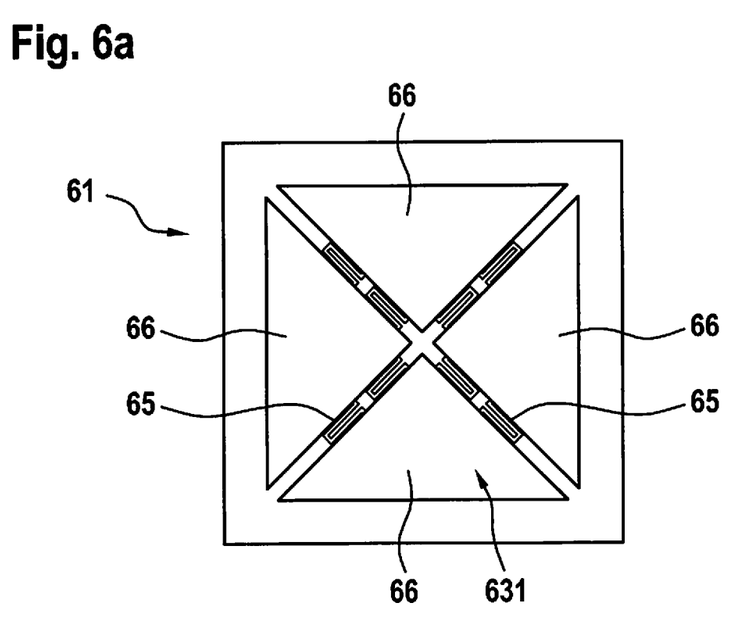
FIGS. 6a, 6b show schematic top views of two further MEMS components 61 and 62 including structured diaphragm elements according to the present invention.
Figure 6B:
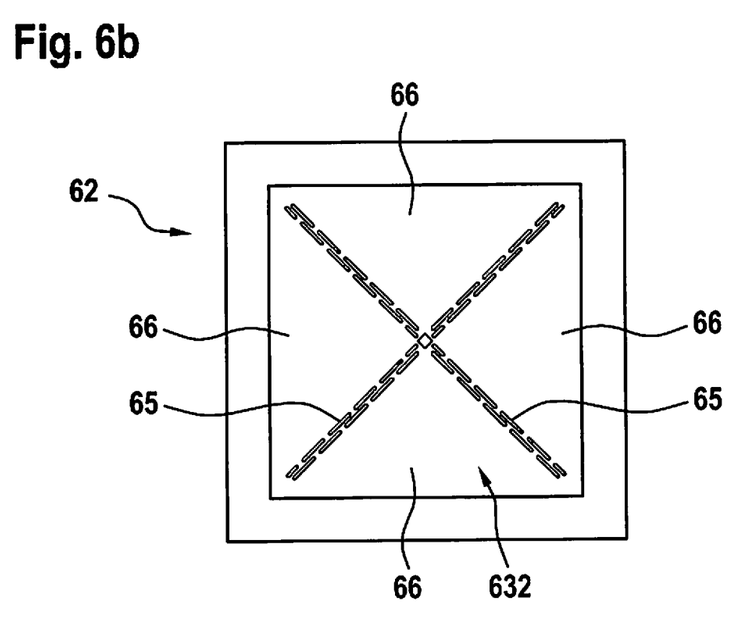

FIGS. 6a and 6b show variants of the above-described sensor design. While, in MEMS components 51 and 52 shown in FIGS. 5a and 5b, diaphragm segments 56 are stiffened by corrugations 571 and 572 and designated bending areas 55, which extend diagonally over the diaphragm surface, are closed, designated bending areas 65, which extend diagonally over the square diaphragm surface, are implemented in the form of spring structures in the case of MEMS components 61 and 62. For this purpose, diaphragm elements 631 and 632 were provided with passage openings in this area. Since diaphragm elements 631 and 632 are otherwise closed, diaphragm segments 66 also have a higher stiffness without additional structuring measures between spring structures 65, so that deformations preferably occur in the area of spring structures 65.

The sensor layout shown in FIGS. 6a and 6b is suitable in particular for microphone applications, since the passage openings in designated bending areas 65 enable a slow pressure equalization between the two sides of diaphragm elements 631 and 632, as is desirable for microphone applications.

What is claimed is:

1. A MEMS component, comprising:
   a layer structure in which at least one sound-pressure-sensitive diaphragm element is formed, the diaphragm element spanning an opening or cavity in the layer structure, the diaphragm element being structured;
   at least one piezosensitive circuit element situated in an area of an attachment of the diaphragm element to the layer structure, deflections of the diaphragm element being detected with the aid of the piezosensitive circuit element;
   wherein the diaphragm element includes at least one designated bending area, in an area of the diaphragm element other than the area of attachment of the diaphragm element to the layer structure, which is defined by the structuring of the diaphragm element and in the event of sound action, is deformed more strongly than adjoining sections of the diaphragm.

2. The MEMS component as recited in claim 1, wherein the diaphragm element includes at least one stiffened diaphragm section, which adjoins the designated bending area, and the stiffened diaphragm section has at least one of: i) a greater thickness than the designated bending area, or ii) corrugations formed therein.

3. The MEMS component as recited in claim 1, wherein an arrangement of spring elements and passage openings is formed in the designated bending area.

4. The MEMS component as recited in claim 1, wherein the attachment of the diaphragm element to the layer structure is concave at least in the section in which the piezosensitive circuit element for signal detection is situated.

5. The MEMS component as recited in claim 1, wherein the diaphragm element is attached via at least one spring element to the layer structure.

6. The MEMS component as recited in claim 1, wherein the at least one designated bending area is a closed portion of the diaphragm element.

7. The MEMS component as recited in claim 1, wherein the at least one designated bending area is located between at least two of the adjoining sections of the diaphragm.

8. The MEMS component as recited in claim 1, wherein the at least one designated bending area includes a portion located at a central area of the diaphragm.

9. The MEMS component as recited in claim 1, wherein the designated bending area includes spring elements and passage openings situated between the adjoining sections of the diaphragm.

10. The MEMS component as recited in claim 1, wherein the diaphragm element includes at least one stiffened diaphragm section, which adjoins the designated bending area, and the stiffened diaphragm section has a greater thickness than the designated bending area.

11. The MEMS component as recited in claim 1, wherein the diaphragm element includes at least one stiffened diaphragm section, which adjoins the designated bending area, and the stiffened diaphragm section has corrugations formed therein.

12. The MEMS component as recited in claim 11, wherein the corrugations include a plurality of parallel grooves.

13. The MEMS component as recited in claim 11, wherein the corrugations include a plurality of protrusions arranged in a grid.

14. A MEMS component, comprising:
   a layer structure in which at least one sound-pressure-sensitive diaphragm element is formed, the diaphragm element spanning an opening or cavity in the layer structure, the diaphragm element being structured;
   at least one piezosensitive circuit element situated in an area of an attachment of the diaphragm element to the layer structure, deflections of the diaphragm element being detected with the aid of the piezosensitive circuit element;
   wherein the diaphragm element includes a plurality of designated bending areas, which are defined by the structuring of the diaphragm element and in the event of sound action, are deformed more strongly than adjoining sections of the diaphragm, and
   wherein the diaphragm element is attached on all sides to the layer structure, the diaphragm element, due to its structuring, includes multiple diaphragm sections of high stiffness, which extend from the diaphragm edge up into a middle area of the diaphragm element, and the diaphragm sections of high stiffness are connected to one another by the designated bending areas, the designated bending areas also extending from the diaphragm edge up into the middle area of the diaphragm element.

* * * * *